United States Patent [19]
Fu et al.

[11] Patent Number: 5,976,334
[45] Date of Patent: Nov. 2, 1999

[54] RELIABLE SUSTAINED SELF-SPUTTERING

[75] Inventors: Jianming Fu, San Jose; Zheng Xu, Foster City, both of Calif.

[73] Assignee: Applied Materials, Inc., Santa Clara, Calif.

[21] Appl. No.: 08/978,433

[22] Filed: Nov. 25, 1997

[51] Int. Cl.⁶ .................................................. C23C 14/00
[52] U.S. Cl. ................ 204/298.19; 204/298.03; 204/298.02; 204/298.13; 204/192.13; 118/723 MA
[58] Field of Search .................... 204/298.19, 298.03, 204/298.02, 192.13, 298.13; 118/723 MA

[56] References Cited

U.S. PATENT DOCUMENTS 5,126,028  6/1992  Hurwitt et al. ................... 204/192.13
5,169,509 12/1992  Latz et al. ......................... 204/298.03
5,667,645  9/1997  Leiphart et al. .................. 204/192.13

*Primary Examiner*—Yogendra Gupta
*Assistant Examiner*—Derrick G. Hamlin
*Attorney, Agent, or Firm*—Charles S. Guenzer

[57] ABSTRACT

A plasma physical vapor deposition (PVD) reactor configured for self sustained sputtering in which no sputtering working gas is required but the sputtered ions are sufficient to sustain the sputtering from the target. According to the invention, the power applied to the sputtering target is monitored to determine if sustained self-sputtering is being maintained. If the electrical parameters or other parameters in the chamber indicate that the self-sustained plasma has collapsed, a reinitialization procedure is begun including: admitting a working gas such as argon into the chamber; again exciting the plasma; and then effectively eliminating the working gas.

19 Claims, 3 Drawing Sheets

RELIABLE SUSTAINED SELF-SPUTTERING

FIELD OF THE INVENTION

The invention relates generally to plasma reactors and their operation. In particular, the invention relates to the plasma deposition of metals and other materials, particularly DC plasma sputtering of metals.

BACKGROUND ART

The increased complexity and density of semiconductor integrated circuits has motivated great advances in the fabrication techniques used to produce them. One of the several important processes involved in fabricating integrated circuits involves the deposition of electrically conducting metal layers. Most typically, the metal deposition is performed by physical vapor deposition (PVD), also known by the more conventional term of sputtering. At the present time, the most common interconnect metal is aluminum, perhaps alloyed with up to a few percent with copper, magnesium, or silicon.

A conventional PVD reactor 10 is illustrated schematically in cross section in FIG. 1, and the illustration is based upon the Endura PVD Reactor available from Applied Materials, Inc. of Santa Clara, Calif. The reactor 10 includes a vacuum chamber 12 sealed to a PVD target 14 composed of the material to be sputter deposited on a wafer 16 held on a heater pedestal 18. A shield 20 held within the chamber protects the chamber wall 12 from the sputtered material and provides the anode grounding plane. A selectable DC power supply 22 biases the target 0 negatively to about −600 VDC with respect to the shield 20. Conventionally, the pedestal 18 and hence the wafer 16 is left electrically floating.

A gas source 24 of sputtering working gas, typically chemically inactive argon, supplies the working gas to the chamber through a mass flow controller 26. A vacuum system 28 maintains the chamber at a low pressure. Although the base pressure can be held to about $10^7$ Torr or even lower, the pressure of the working gas is kept between about 1 and 1000 mTorr.

A computer-based controller 30 controls the reactor including the DC power supply 22 and the mass flow controller 26.

When the argon is admitted into the chamber, the DC voltage between the target 14 and the shield 20 ignites the argon into a plasma, and the resultant positively charged argon ions are attracted to the negatively charged target 14. The ions strike the target 14 at a substantial energy and cause target atoms or atomic clusters to be sputtered from the target 14. Some of the target particles strike the wafer 16 and are thereby deposited on it, thereby forming a film of the target material.

To provide efficient sputtering, a magnetron 32 is positioned in back of the target 14. It has opposed magnets 34, 36 creating a magnetic field within the chamber in the neighborhood of the magnets 34, 36. The magnetic field traps electrons, and to maintain charge neutrality the ion density also increases to form a high-density plasma region 38 within the chamber adjacent to the magnetron 32.

Another area of recent development in PVD reactors involves the use of a high-density plasma (HDP), often achieved by RF inductive coils placed around the cylindrical walls 12 of the chamber. The inductively coupled RF power creates an intense plasma. One advantage of HDP sputtering is the increased density of argon ions increases the sputtering rate. Another and perhaps more important advantage is that the intense plasma causes a substantial fraction of the sputtered particles to be ionized. Such ionized sputtered particles may be controllably accelerated across the plasma sheath adjacent to the wafer. The resultant forward peak in the velocity distribution, unlike the more normal nearly isotropic distribution for neutral sputtered particles, is effective in causing the sputtering to fill contact and via holes that are narrow and deep, that is, have a high aspect ratio.

For a number of reasons, mostly related to the decreasing dimensions of metal interconnects in advanced integrated circuits, many now believe that aluminum interconnects should be replaced by interconnects of other materials, one of the most prominent being copper. Copper can be easily sputtered in the PVD reactor of FIG. 1 by using a target 14 composed of copper.

It has been recognized that many of the advantages of HDP-PVD can be attained in copper sputtering with the more conventional PVD reactor of FIG. 1 using sustained self-sputtering, as has been explained for example by Fu et al. in U.S. patent application, Ser. No. 08/854,008, filed May 7, 1997, incorporated herein by reference. A reactor 50 illustrated in the cross-sectional view of FIG. 2 includes the reactor described by Fu et al. as well as features of the invention.

The reactor 50 of Fu et al. differs from the conventional PVD reactor 10 of FIG. 1 in a number of features, even aside from the target 14 being composed of copper so as to accomplish copper sputtering. A high-field magnetron 52 is composed of a button magnet 54 surrounded by an oppositely polarized ring magnet 54. Unillustrated mechanisms scan the magnetron 52 circumferential and radially about the chamber axis 58 so as to increase the uniformity of sputter deposition and to reduce wastage of the target.

The magnetron 52 is designed to produce a very high magnetic field in the high-density plasma region 38 so as to produce a plasma region 38 of even higher density. The plasma density is so high that no argon working gas is required to sustain the plasma, but the copper ion density in the high-density plasma region 38 is sufficiently high for the copper ions to themselves resputter the target 14. It should be mentioned that conventionally a plasma can be induced and sustained in the parallel-plate configuration of either FIG. 1 or FIG. 2 only if the gas pressure is maintained above a minimum value in the milliTorr range. For sustained self-sputtering, once the plasma has been ignited, the controller 30 can turn off the argon supply valve 26, and the chamber pressure is reduced to an extremely low residual value, $10^{-8}$ Torr vs. $10^{-3}$ Torr and above in conventional sputtering.

Sustained self-sputtering offers a number of advantages. The possibility of argon being included in the sputter deposited material is eliminated. The high ionization fraction of the sputtered copper particles allows directional control of the copper being sputter deposited, thereby allowing better hole filling. For example, a grid anode 60 may be placed between the target 14 and the wafer 16 to act as the grounding plane for the sputter plasma. Since the grid anode 60 is in planar opposition to the target 14, the electrostatic attraction is nearly perpendicular to the wafer 16 rather than curved to the conventional grounding plane of the cylindrical shield 20. A DC power supply 62 controls the voltage of the grid 62 to a small positive value with respect to the pedestal 18. An additional variable power supply 66 biases the pedestal 18 independently of the grounded shield 20 and thus controls the velocity of the copper ions incident on the wafer 16. The power supply 66 for the pedestal 18 may be an RF power supply to control the plasma sheath voltage with a DC self-bias or may be a DC power supply or ground to provide direct DC control relative to the grid 60 or may be combination of RF and DC supplies.

As alluded to above and described in more detail by Fu et al., sustained self-sputtering requires an ignition sequence. The controller 30 opens the mass flow controller 26 between the argon source 24 and the vacuum chamber to build up sufficient argon pressure in the chamber to ignite a conventional plasma. Once the plasma has been ignited, the controller 30 turns off the mass flow controller 26 to stop the flow of argon into the chamber. However, as described above, the plasma discharge sustains itself after the interruption of argon because of the very high copper plasma density in the region region 38 adjacent to the high-field magnetron 52.

In commercial operation of this type of equipment, reliability is a major concern. Semiconductor fabrication equipment is costly, and downtime must be minimized. The processing is being performed upon partially processed wafers in which substantial amounts of processing time and costs have been invested. Abnormalities in the equipment need to be immediately detected and if possible immediately corrected.

The electrical power supplied to a reactor is not completely reliable. Commercially supplied power is subject to major and minor excursions, an example of which would be lightning striking outside power lines. Power conditioning equipment is usually used to suppress the excursions, but it does not provide complete protection. The large amounts of power being used in sputtering makes it difficult to buffer longer events.

Other types of temporary malfunctions can occur. The biased target may occasionally electrically arc to the grounded chamber or shield. Although the discharge may be relatively short, it presents a low impedance path and carries a large amount of current sufficient to debias the target and extinguish the plasma.

For most type of equipment, an arc or a power glitch may cause temporary malfunctions, but once the excursions have disappeared the equipment immediately restarts. Sustained self-sputtering however presents added difficulties. The time constants involved in these plasma processes are very short, and the operating margins for sustained self-sputtering are small. A relatively small or short power glitch may be enough to extinguish the sustained self-sputtering. Once it has been stopped, return of normal electrical power conditions will not be sufficient to reignite the plasma. Accordingly, it is desirable to have a procedure that detects interruptions to sustained self-sputtering and preferably automatically restarts the sustained self-sputtering.

SUMMARY OF THE INVENTION

The invention can be summarized as a sputtering system in which during normal sputtering the power delivered to the target is monitored to determine if the plasma has collapsed. If extinguishment of the plasma has been detected, a reignition sequence is performed to again excite the plasma and to continue sputtering.

The invention is particularly applicable to sustained self-sputtering in which the particles sputtered from the target are substantially ionized and are themselves used to sputter the target. In sustained self-sputtering, a working gas such as argon is admitted to the chamber to ignite the plasma, but once the plasma is ignited the chamber pressure is substantially reduced.

In sustained self-sputtering, the reignition may consist of pulsing a burst of working gas into the chamber with no change in the powering conditions.

In low-pressure sputtering with a working gas, the reignition may include the increasing the pressure of the working gas or other techniques normally used in striking the plasma.

Target power may be monitored by measuring the target voltage. A collapse of the plasma is indicated by a rise of the voltage. If the rise is greater than a threshold value, the reignition step is initiated.

Alternatively, target power may be monitored by measuring the current delivered to the target. A collapse of the plasma is indicated by a substantial drop of the target current, usually to nearly zero. If the current drop is above a threshold or the measured current is less than a threshold, the reignition step is initiated.

DETAILED DESCRIPTION OF THE PREFERRED EMBODIMENTS

When a sustained self-sputtering plasma is extinguished for whatever reasons, the power supplied to the target is substantially lessened since a low-impedance plasma no longer exists in the PVD chamber. The current normally injected from the target through the plasma to various grounding points substantially decreases, usually to a value close to zero. The electrical power supply biasing the target is typically not very stiff. Hence, when the low-impedance conductivity path through the plasma disappears, the voltage appearing on the target usually increases.

According to the invention, a power monitor 70 is inserted in the electrical supply path to the target 14. The controller 30 receives an electrical output of the power monitor 70 and determines when the power or other electrical parameter changes sufficiently to indicate that the sustained self-sputtering plasma has collapsed for whatever reason. If the controller 30 has not otherwise instructed the extinguishment of the plasma, upon detection of no plasma, the controller 30 executes a procedure to reignite the plasma.

The power monitor can assume a number of forms. It can measure the current being provided to the target. A monitoring resistor or current-sensitive inductive coil can be placed at any point between the target and its power grounding point, and the voltage drop across the resistor or voltage induced in the coil measures the target current. The power monitor can also monitor the voltage of the target. In this case, the power monitor is a voltage tap on the power line between the power supply 22 and the target, and a signal conditioner will probably be required to input the measured voltage to the controller 30. If the plasma collapses, the voltage will rise by an amount dependent upon the details of the DC power supply. Actually the magnitude of the voltage will increase since a negative voltage is applied to the target, that is, a bigger negative voltage. The power monitor may monitor an electrical parameter dependent upon both the current and voltage, e.g., the power being delivered. The DC power supply is usually a relatively complex electronic circuit, and voltages or currents at various points in the DC power supply itself will indicate the power being delivered to the target. Thus, in a well characterized reactor, the power can be monitored by measuring either voltage or current. A drop of power delivered to the target is indicated either by a rise in the magnitude of the voltage of the target or by a drop in the current.

Figure 1:
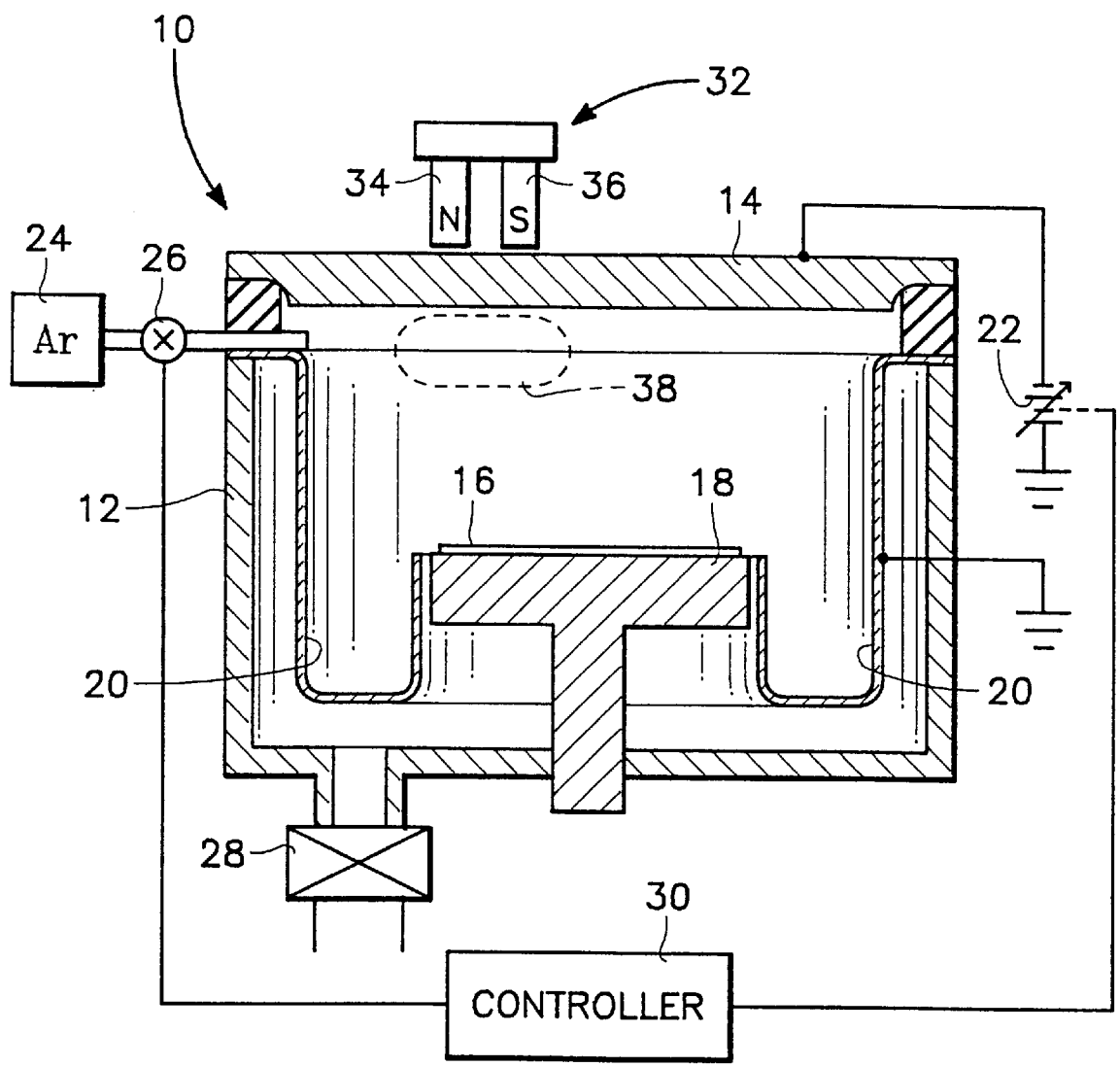
FIG. 1 is a cross-sectional view of a conventional PVD reactor.
Figure 2:
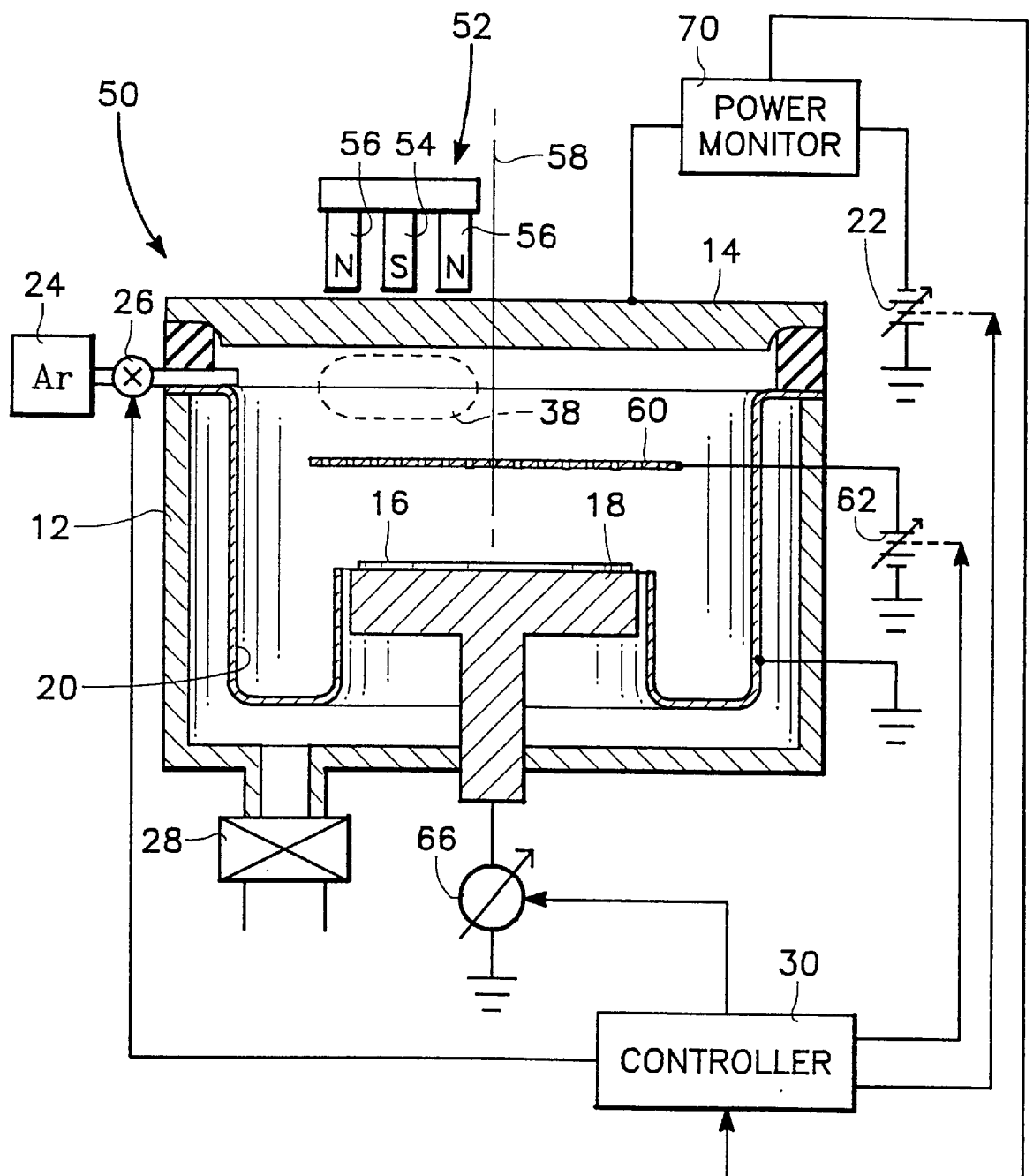
FIG. 2 is a cross-sectional view of a sustained self-sputtering PVD reactor incorporating one embodiment of the invention.
Figure 3:
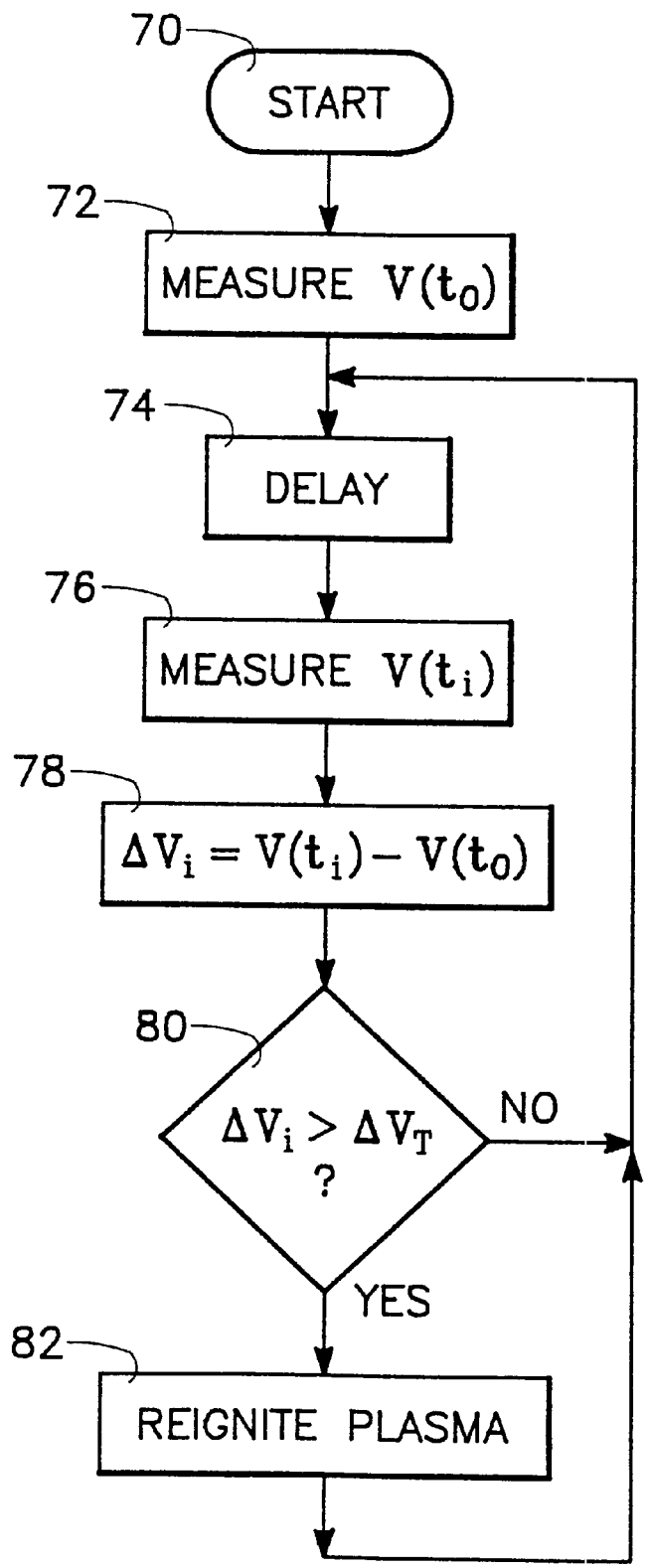
FIG. 3 is a flow diagram of the monitoring procedure performed in the reactor system of FIG. 2.

A sequence for performing the monitoring and restarting of the invention is illustrated in the flow diagram of FIG. 3. The computer included in or with the controller may programmed to perform the sequence. The power monitoring will involve measuring the voltage applied to the target at a point close to the target. The sequence begins with a start activation 70 associated with the planned self-sustained plasma activation, as described by Fu et al. After a time $t_0$ sufficiently long to guarantee that the target voltage has settled to a value proper for sustained self-sputtering, the power monitor in step 72 measures the baseline target voltage $V(t_0)$. Note that the voltages defined here are assumed to be positive even though they are negative when taking the physics into account. After the baseline measurement, the operation enters a monitoring loop. After a delay 74, the power monitor again measures the target voltage $V(t_i)$ at time $t_i$. The length of the delay 74 should be longer than anticipated transients but still relatively short compared to the duration of a sputtering step, for example, a delay of 0.1 to 1 second. In step 78, the current target voltage is compared to the baseline target voltage. Specifically, a voltage difference is calculated as $$\Delta V_i = V(t_i) - V(t_0) \tag{1}$$

A test 80 is then made whether the voltage difference $\Delta V_i$ is larger than a threshold difference $\Delta V_T$. If not, the execution remains within the monitoring loop.

However, if the magnitude of the target voltage has increased so that the difference voltage $\Delta V_i$ is greater than the threshold difference $\Delta V_T$, a reignition step 82 is performed. The ignition process of Fu et al. could be executed, which involves turning off the target power, turning on the argon flow, and then slowly increasing the target power. However, in the present situation, it is often sufficient in the reignition step 82 to leave the target power supply at its sustained setting and causing the argon mass flow controller 26 to pulse argon into the chamber for 2 to 3 seconds. The argon will be sufficient to ignite the plasma. After the argon flow is discontinued, the vacuum system quickly removes the argon from the chamber, and the sputtering mode returns to sustained self-sputtering. After the plasma has been reignited, operation of the sequence returns to the monitoring loop.

The short argon pulse should not be long enough to substantially impact most processes. That is, the sputtering can continue as though no interruption occurred. Although it is possible that the interruption ruined the wafer being sputter coated at the time of the operation, the quick return to service eliminates the need to warm up the PVD chamber and to rearrange the complex sequencing when the PVD reactor is part of a multi-chamber cluster tool. During the restart, the wafer may remain in the chamber.

It is to be appreciated that the flow diagram is illustrative only of the required functions. to In common software practice, the same functions can be achieved by activating a monitoring function, including a timer to initiate a voltage measurement, and issuing an interrupt when the fault condition has been determined. Alternatively, the principal program can periodically invoke a target monitoring step. In a third approach, a separate computer system performs the monitoring and invokes the principal computer system controlling the chamber upon detection of a fault condition. In a fourth approach, non-computerized digital or analog circuitry implements the monitoring function and issues the interrupt signal or status signal to the chamber computer system upon detection of a fault condition.

Alternatively, current delivered to the target can be monitored, either with a DC or an AC (time derivative) technique. When the plasma collapses, the low-impedance path from the target to the current return path is disrupted. The result is that the target current significantly decreases, usually to zero or a value close to it. The test for current may be similar to the test for voltage in FIG. 3, that is, whether the drop of current is greater than a threshold value. Alternatively, the current may be tested for whether the observed current is less than a threshold value.

The monitoring sequence of FIG. 3 can be improved in a number of ways. For example, a filtering process may be included in the test 80 to include a number of sequentially measured voltages before indicating a fault condition based upon some average of the sequence. Thereby, electronic transients in the measuring circuitry or self-healing transients in the plasma will not trigger a fault condition. Also, it is anticipated that the controller will generate a log of reignition events. Of course, the reignition needs to be inhibited if the controller intends to turn off the plasma.

Sustained self-sputtering is most frequently applied to sputtering of copper and its alloys. However, some other materials allow for sustained self-sputtering, as has been explained by Fu et al.

For a number of reasons, some of which were discussed in the background section, it is desirable to operate a conventional PVD reactor, that is, one not relying on sustained self sputtering, in the low-pressure regime. Low pressure is here defined as a pressure only slightly above the plasma threshold pressure. In this low-pressure operation, power glitches may extinguish the plasma. Furthermore, special ignition or striking operations may need to be performed with low-pressure sputtering. The invention can be applied to these low-pressure and similarly sensitive sputtering chambers. If the plasma has been observed to collapse or to be operating in a substantially different mode, a reignition process proper for that type of operation is invoked.

The invention thus provides a simple method of increasing the reliability of a sustained self-sputtering reactor and similar plasma reactors.

What is claimed is:

1. A PVD plasma reactor system, comprising:
   a chamber to which is mountable a target;
   a valve controlling a supply of a working gas into said chamber;
   a source of DC electrical power connectable to said target and capable of exciting said gas into a plasma;
   a power monitor monitoring a supply of said DC electrical power to said target; and
   a controller controlling said valve in response to a change in an output of said power monitor.

2. The system of claim 1, wherein said power monitor monitors a voltage associated with said target.

3. The system of claim 2, wherein said controller compares a change in said monitored voltage to a threshold value.

4. The system of claim 1, wherein said power monitor monitors a current delivered to said target.

5. The system of claim 4, wherein said controller compares a change in said monitored current to a threshold value.

6. The system of claim 4, wherein said controller compares said monitored current to a threshold value.

7. The system of claim 1, further comprising a magnetron positioned adjacent to said target and enabling said power supply to self-sustain a plasma with ions from said target.

8. The system of claim 7, wherein said target comprises copper.

9. A method of maintaining a plasma in a sputtering chamber, comprising the steps of:

placing a substrate to be fabricated into integrated circuits into a plasma sputtering chamber;

admitting a working gas into said sputtering chamber;

applying electrical power to a target in said sputtering chamber to cause said working gas to form a first plasma, to thereby sputter material of said target onto said substrate;

monitoring said electrical power delivered to said target; and setting a threshold of said electrical power indicating a need to reignite said plasma.

10. The method of claim 9, further comprising, if said monitoring step indicates a change of said electrical power greater than said threshold, reigniting a second plasma in said chamber while said substrate remains in said chamber.

11. The method of claim 10, wherein said reigniting step includes increasing a flow of said working gas into said chamber.

12. The method of claim 9, wherein, after said applying step has ignited said first plasma, further comprising the step of substantially reducing a flow of said working gas into said chamber, wherein a material of said target causes sustained self-sputtering of said target.

13. The method of claim 11, wherein said target comprises copper.

14. The method of claim 10, wherein said reigniting step includes pulsing said working gas into said chamber.

15. A PVD plasma reactor system, comprising:

a chamber to which is mountable a target;

a valve controlling a supply of a working gas into said chamber;

a source of DC electrical power connectable to said target and capable of exciting said gas into a plasma;

a power monitor monitoring a supply of said DC electrical power to said target; and means responsive to a change in an output of said power monitor for controlling said valve.

16. A PVD plasma reactor system, comprising:

a chamber to which is mountable a target;

a valve controlling a supply of a gas into said chamber;

a source of electrical power supply connectable to said target and capable of exciting said gas into a plasma;

a power monitor monitoring a supply of said electrical power to said target, wherein said power monitor monitors a voltage associated with said target; and a controller controlling said valve in response to an output of said power monitor, wherein said controller compares a change in said monitored voltage to a threshold value.

17. The system of claim 15, wherein said gas comprises argon.

18. A PVD plasma reactor system, comprising:

a chamber to which is mountable a target;

a valve controlling a supply of a gas into said chamber;

a source of electrical power supply connectable to said target and capable of exciting said gas into a plasma;

a power monitor monitoring a supply of said electrical power to said target, wherein said power monitor monitors a current delivered to said target; and a controller controlling said valve in response to a change in an output of said power monitor.

19. The system of claim 17, wherein said gas comprises argon.

* * * * *